(12) United States Patent
Huang et al.

(10) Patent No.: US 7,119,607 B2
(45) Date of Patent: Oct. 10, 2006

(54) APPARATUS AND METHOD FOR RESONANCE REDUCTION

(75) Inventors: Mingwei Huang, Hillsboro, OR (US); Cangsang Zhao, Portland, OR (US)

(73) Assignee: Intel Corporation, Santa Clara, CA (US)

(*) Notice: Subject to any disclaimer, the term of this patent is extended or adjusted under 35 U.S.C. 154(b) by 450 days.

(21) Appl. No.: 10/331,659

(22) Filed: Dec. 31, 2002

(65) Prior Publication Data

US 2004/0124715 A1 Jul. 1, 2004

(51) Int. Cl.
*H04B 1/10* (2006.01)
*H02J 1/02* (2006.01)
*H03H 11/16* (2006.01)

(52) U.S. Cl. .................. 327/551; 327/256; 333/12; 363/39

(58) Field of Classification Search .......... 333/12; 257/433; 323/208; 363/39; 327/47, 256, 327/257, 551; 326/30
See application file for complete search history.

(56) References Cited

U.S. PATENT DOCUMENTS

| | | | |
|---|---|---|---|
| 3,654,615 A | 4/1972 | Freitag | |
| 4,600,823 A | 7/1986 | Hiejima | |
| 4,670,714 A * | 6/1987 | Sievers et al. | 324/133 |
| 4,857,777 A * | 8/1989 | Altes | 327/255 |
| 5,227,964 A | 7/1993 | Furuhata | |
| 5,351,197 A | 9/1994 | Upton et al. | |
| 5,446,647 A | 8/1995 | Ikeda et al. | |
| 5,459,420 A * | 10/1995 | Imai et al. | 327/171 |
| 5,594,635 A | 1/1997 | Gegner | |
| 5,757,099 A * | 5/1998 | Cheng et al. | 307/105 |
| 5,900,763 A * | 5/1999 | Rahim et al. | 327/292 |
| 6,108,000 A | 8/2000 | Bolotski et al. | |
| 6,111,445 A * | 8/2000 | Zerbe et al. | 327/231 |
| 6,415,004 B1 * | 7/2002 | Fujimura et al. | 375/324 |
| 6,611,130 B1 | 8/2003 | Chang | |
| 6,781,355 B1 * | 8/2004 | Gauthier et al. | 323/233 |
| 6,984,965 B1 | 1/2006 | Vinciarelli | |
| 2002/0191418 A1 | 12/2002 | Clayton et al. | |
| 2003/0021127 A1 | 1/2003 | Loef et al. | |
| 2003/0084415 A1 | 5/2003 | Sasaki et al. | |
| 2004/0076025 A1 | 4/2004 | Gauthier et al. | |
| 2004/0124715 A1 | 7/2004 | Huang et al. | |

(Continued)

FOREIGN PATENT DOCUMENTS

JP 02051895 A 2/1990

(Continued)

OTHER PUBLICATIONS

Ang et, al. , An On-Chip Voltage REgulator Using Switched Decoupling Capacitors, ISSCC 200/ Session 26/ Analog Techniques/ PAper WP 26.7, pp. 1-2.

(Continued)

*Primary Examiner*—Lynn Feild
*Assistant Examiner*—Michael Rutland-Wallis
(74) *Attorney, Agent, or Firm*—Blakely, Sokoloff, Taylor & Zafman LLP

(57) ABSTRACT

A system is provided that includes a power distribution network to provide a switching current and a resonance reduction circuit to sense the switching current within a frequency range and to generate a resonance reduction signal having a current component at substantially a same frequency and substantially 180 degrees out of phase from the sensed switching current. The power distribution network may combine the switching current with the resonance reduction signal to provide a total switching current that may be provided to a processor as the powering signal.

34 Claims, 12 Drawing Sheets

U.S. PATENT DOCUMENTS

2004/0184289 A1   9/2004   Vinciarelli
2005/0093475 A1   5/2005   Kuennen et al.

FOREIGN PATENT DOCUMENTS

JP   07058619 A   3/1995
JP   10248183 A   9/1998

OTHER PUBLICATIONS

Corman et al., "Burst Technology with Feedback-Loop Control for Capacitive Detection & Electrostatic Excitation of Resonant Silicon Sensors," IEEE Transactions on Electron Devices, vol. 47, No. 11, Nov. 2000, pp. 2228-2235.

* cited by examiner

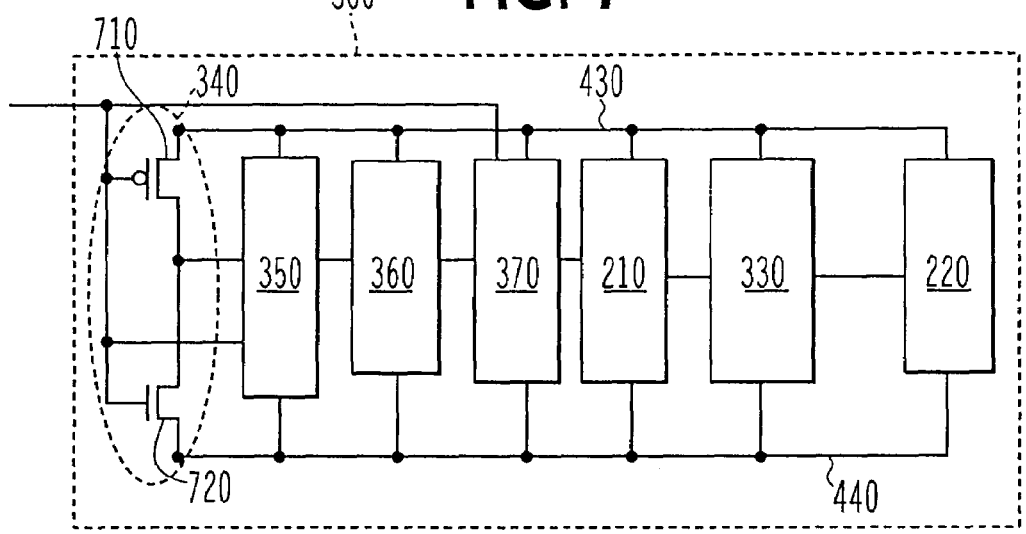
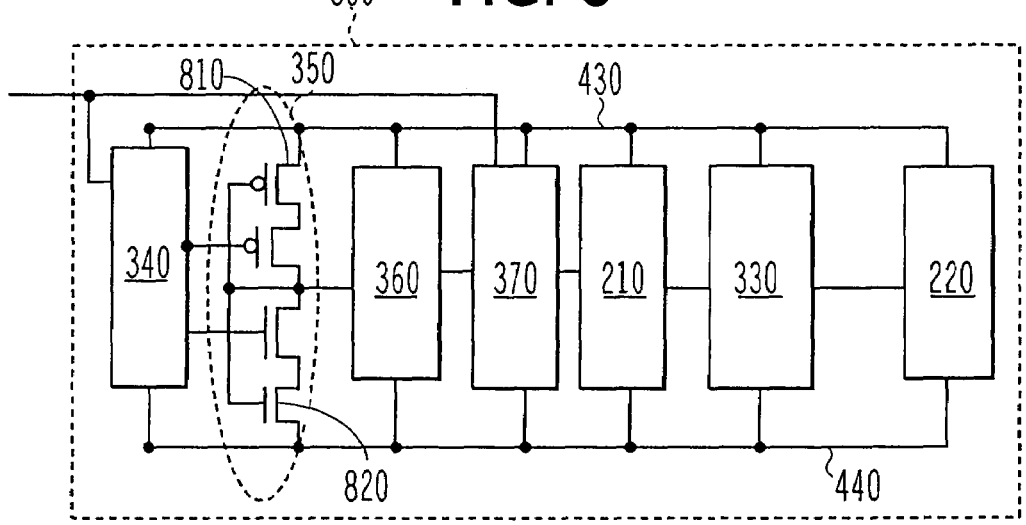

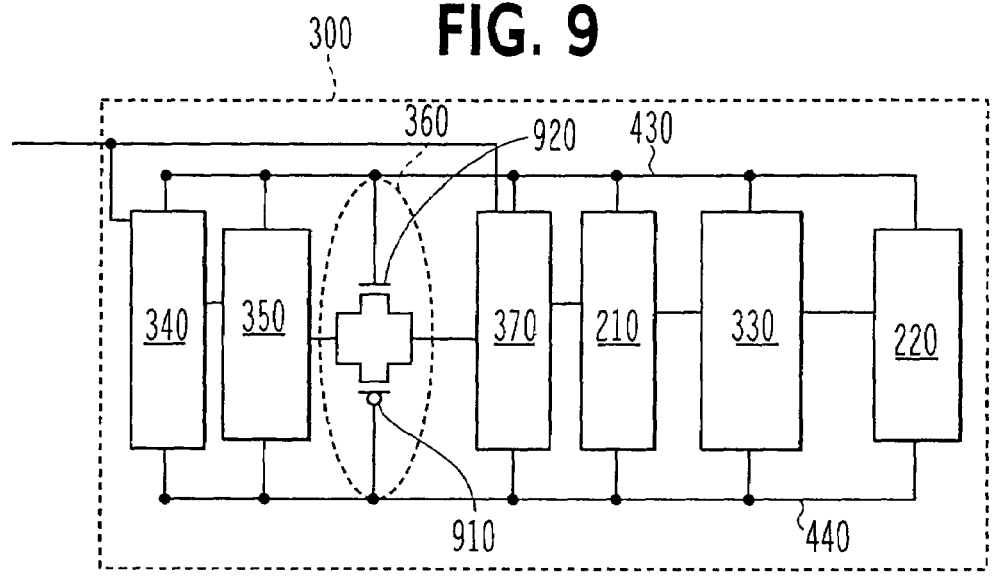
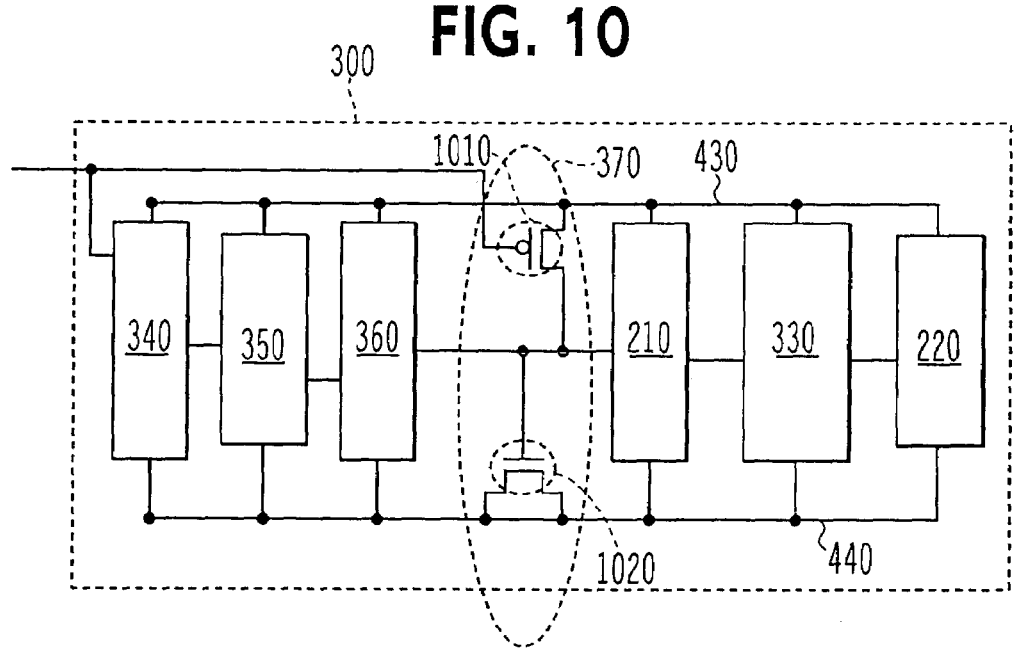

APPARATUS AND METHOD FOR RESONANCE REDUCTION

FIELD

The present invention is directed to an apparatus and method to reduce resonance.

BACKGROUND

Processors may include a large number of transistors and other components interconnected on a common die (chip). The processor may be mounted on a substrate forming a package. The package may be subsequently mounted on a printed circuit board or motherboard for further installation in an electronic system. Designers may strive to increase operating frequencies (e.g., clocking speeds) of the processor. However, as the speed of the processors increases, the power consumption tends to increase. This makes it difficult to maintain an applied power level within a prescribed range.

The effectiveness of a processor may be a function of the efficient utilization of power. The effective power supply voltage applied to a processor's components may be reduced by package resonance. As the package resonance increases, the processor effectiveness may decrease. A lower effective power supply may consequently limit the attainable operating speed of the processor.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIG. 7 is a diagram of the resonance reduction circuit from FIG. 3 and further showing an enable stage according to an example arrangement;

FIG. 8 is a diagram of the resonance reduction circuit from FIG. 3 and further showing a bias stage according to an example arrangement;

FIG. 9 is a diagram of the resonance reduction circuit from FIG. 3 and further showing a bandwidth adjustment stage according to an example arrangement;

FIG. 10 is a diagram of the resonance reduction circuit from FIG. 3 and further showing an alternating current (AC) stage according to an example arrangement;

DETAILED DESCRIPTION

Figure 1:
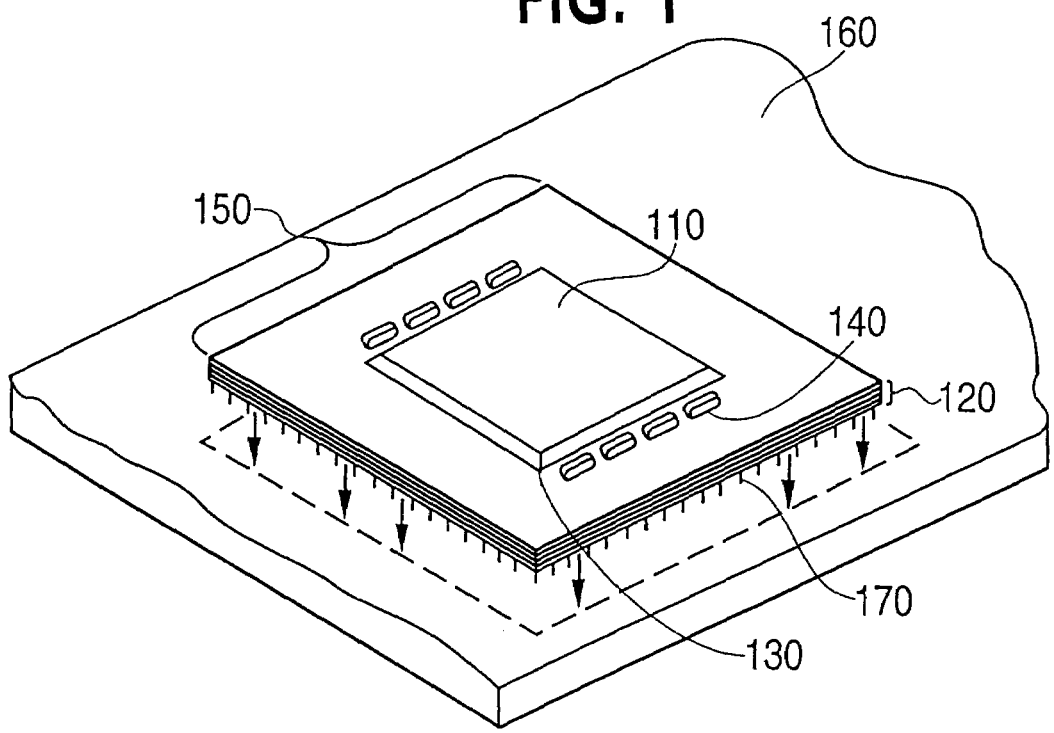
FIG. 1 shows a perspective view of an integrated circuit (IC) printed circuit board (PCB) carrier package system according to an example arrangement.

In the following detailed description, like reference numerals and characters may be used to designate identical, corresponding or similar components in differing figure drawings. Further, in the detailed description to follow, example values may be given, although the present invention is not limited to the same. The terms HIGH and LOW may be used in an intended generic sense. However, embodiments and arrangements are not limited to the illustrated/described signals, but may be implemented with a total/partial reversal of the signals by a simple change in logic. Well known power/ground connections to integrated circuits (ICs) and other components may not be shown within the figures for simplicity of illustration and discussion, and so as not to obscure the invention. Further, where specific details (e.g., circuits) are set forth in order to describe example arrangements and embodiments of the invention, it should be apparent to one skilled in the art that the invention can be practiced without, or with variation of, these specific details. Finally, it should be apparent that differing combinations of hard-wired circuitry may be used to implement embodiments of the present invention. That is, the present invention is not limited to any specific combination of hardware.

FIG. 1 shows a partial perspective view of an example integrated circuit (IC) printed circuit board (PCB) carrier package system according to an example arrangement. More particularly, FIG. 1 shows a die 110 (e.g., flip-chip) mounted on a substrate 120. Conductive bumps/balls (not shown) and underfill 130 may provide the electrical connection and the mechanical attachment of the die 110 to the substrate 120. Additional electrical components may also be present on the substrate 120 such as die-side capacitors 140, for example. The grouping of the die 110, the substrate 120, and associated electrical components (e.g., the die-side capacitors 140) may constitute a package 150. The package 150 can be further mounted to a PCB (e.g., motherboard) 160 with pins 170 for further incorporation of the PCB (e.g., motherboard) 160 into an electronic system.

Resonance of the package 150 may be detrimental by causing unwanted sustained and transient oscillations, which in turn may cause noise and signal distortion. Die operating frequencies are increasing while package resonant frequencies are not changing appreciably. Therefore, there may be a greater number of clock cycles per one package resonant cycle and a greater probability for a programmable microprocessor to operate in a zone that modulates the package at it's respective resonant frequency. The effects of package resonance may be progressively worsening as higher frequencies are generated. For a package that operates at a constant, predictable clock rate, it may be easier to anticipate, and design around, possible resonant troublespots. However, with programmable microprocessors, the anticipated clock rate may be more difficult to anticipate.

To decrease the package resonance, example arrangements may increase the on-die decoupling capacitance. However, to effectively limit the package resonance, an undesirable amount of on-die decoupling capacitance may be required to limit the package resonance amplitude since that amount of on-die decoupling capacitance comes with significant amounts of gate leakage current. If the leakage current is too great, an inefficient, impractical power source may be required.

The resonance of the on-chip decoupling capacitance can result in an oscillation in the supply voltages. While the resulting voltage fluctuations can be dampened by increasing the resistance there may be a resistive voltage drop in such an arrangement. For a larger and slower processor, gate leakage may not be as much a concern as with a faster and smaller processor requiring increased power. The large number of capacitors that may be required in this type of arrangement may lead to an amount of leakage current introduced into the system that decreases the system effectiveness below an acceptable margin. As both the power consumption and the clocking speeds increase, the switching current at local power nodes may require an increased number of high frequency capacitors to offset the power losses associated with the parasitic board and package inductances near the resonance frequency of the package. However, the available real estate for these capacitors decreases as the requirement for the number of capacitors increases. Consequently, future power consumption may be limited by such passive capacitors.

The package resonance may also be decreased by increasing a series resistance of the package capacitance, thereby increasing the resistive damping. However, increased series resistance on the package capacitance may lead to increased power supply droops, and lowers maximum frequency and total processing power. In addition, a specification of series resistance for package capacitors may be more costly since a minimum resistance for a capacitor may need to be specified and more package area utilized than an on-die arrangement. The resistance may also be altered by including additional discrete resistors or changes in material composition. However, these additions may result in unwanted inductance, additional components, and costly implementation with new installation methodology (e.g., solder techniques).

Additionally, the package resonance may also be reduced by an on-die switched capacitance circuit that lessens the required amount of on-die decoupling capacitance. However, such an arrangement may still require significant amounts of capacitance with negative impact on both the available die area and the leakage current. Further, such a disadvantageous switched capacitor circuit arrangement may not substantially dissipate energy at a frequency to effectively reduce the impact of such a resonance power supply voltage.

Resonance may also be reduced by detecting supply resonance and removing a charge. For example, the supply resonance may be detected with a N-channel metal-oxide-semiconductor (NMOS) device capacitor. When detecting an extra charge or energy in the power system (e.g., when VCC−VSS may be larger than the averaged VCC−VSS), one arrangement may remove a charge from the power system. Alternatively, charges may be returning to the power system when detecting less charges or energy in the power system (e.g., when VCC−VSS may be smaller than the averaged VCC−VSS). Such an arrangement may remove charges by dissipating current through a current source NMOS.

Figure 2:
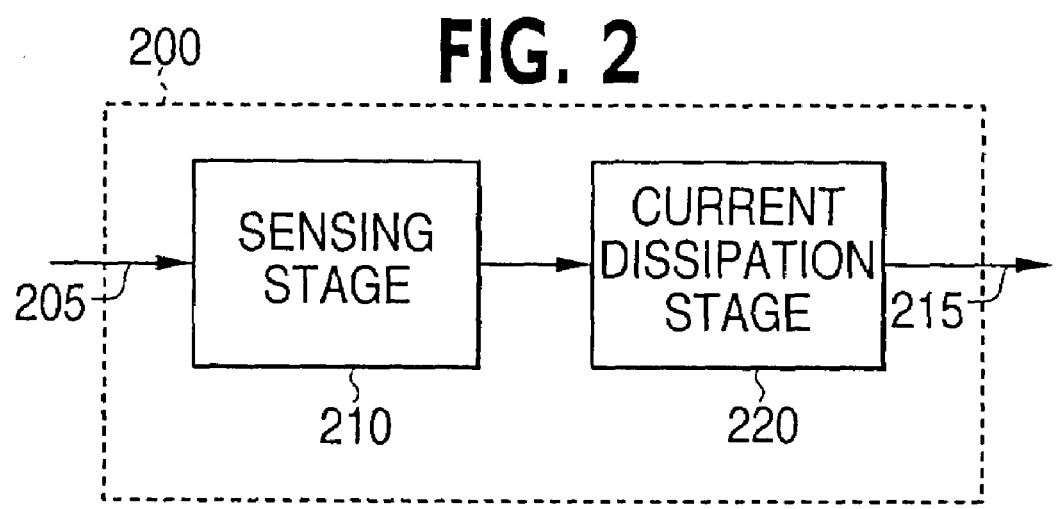
FIG. 2 is a block diagram of a resonance reduction circuit according to an example arrangement.

FIG. 2 is a block diagram of a resonance reduction circuit (RRC) 200 according to one example arrangement. Other arrangements are also possible. The resonance reduction circuit 200 may include a sensing stage 210 and a current dissipation stage 220. The sensing stage 210 may receive a signal 205 input from the package through the die. When resonance is detected by the sensing stage 210, the current dissipation stage 220 may dump charges 215. Both the sensing stage 210 and the current dissipation stage 220 may be coupled to a VCC_on_the_die (VCC) and a VSS_on_the_die (e.g., ground) (VSS).

Figure 3:
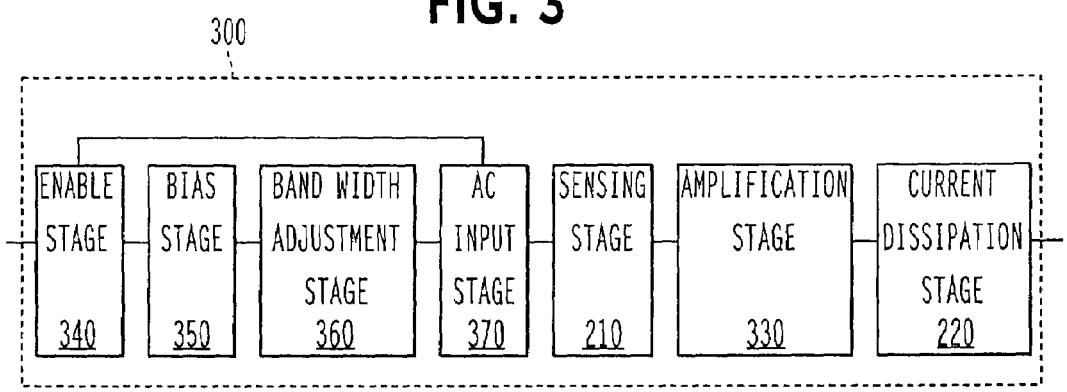
FIG. 3 is a block diagram of a resonance reduction circuit according to an example arrangement.

FIG. 3 is a block diagram of a resonance reduction circuit (RRC) 300 according to an example arrangement. Other arrangements are also possible. The resonance reduction circuit 300 may include the sensing stage 210 and the current dissipation stage 220 (from FIG. 2) as well as include other stages such as an amplification stage 330, an enable stage 340, a bias stage 350, a bandwidth adjustment stage 360, and an AC input stage 370. The stages 330, 340, 350, 360 and 370 may also be electrically coupled between VCC and VSS.

The bias stage 350 and the sensing stage 210 may be electrically matched (or approximately matched) to each other. The current dissipation stage 220 may dump a charge from VCC to VSS when the power system has extra charges or energy. The dumping of a charge from VCC to VSS may reduce the resonance energy and amplitude. The amplification stage 330 may amplify a sensed signal (from the sensing stage 210) and set a high frequency cut-off bandwidth. This arrangement may activate or deactivate a stage with a direct current (DC) control signal from the enable stage 340. The bandwidth adjustment stage 360 may set a low frequency cut-off bandwidth. The supply resonance may be detected by an NMOS device capacitor in the AC input stage 370, for example.

Details of the various stages 330, 340, 350, 360 and 370 will be individually discussed below with respect to each of FIGS. 4–10. While the figures may show components as being within a particular stage, one skilled in the art would understand that the dividing line between stages is not necessarily a particular point or line. Rather, the combination of the components within the stages or within the circuit may provide the overall features of the stages. Arrangements and embodiments should not be limited by the discussion of what elements are provided within or outside of a respective stage.

Figure 4:
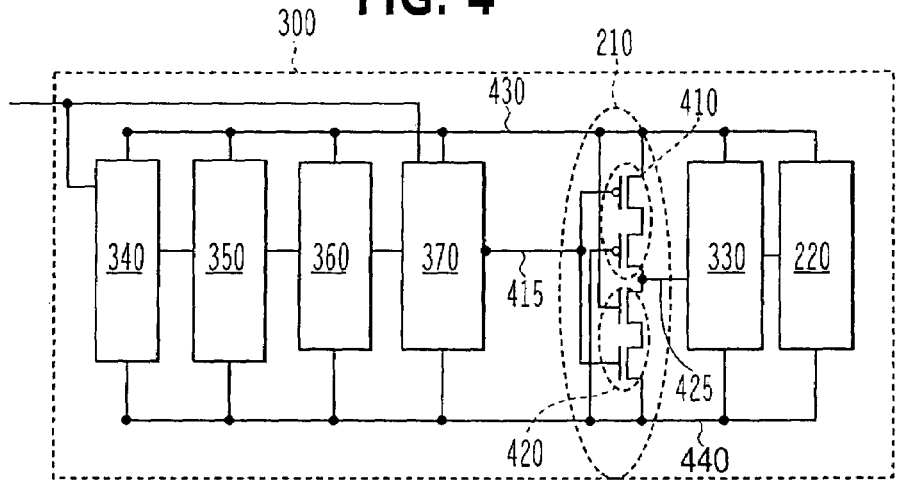
FIG. 4 is a diagram of the resonance reduction circuit from FIG. 3 and further showing a sensing stage according to an example arrangement.

FIG. 4 is a diagram of the resonance reduction circuit from FIG. 3 and further showing details of the sensing stage 210 according to an example arrangement. Other arrangements are also possible. The sensing stage 210 may include a set 410 of p-type transistors and a set 420 of n-type transistors. Other numbers and types of transistors are also possible. FIG. 4 also shows the electrical connection of the transistors to VCC 430 and to VSS 440. The sensing stage 210 may receive an input signal from the AC input stage 370 along a signal line 415 and provide an output along a signal line 425 to the amplification stage 330 when resonance is sensed. The width of each of the p-type transistors within the set 410 may be greater than the width of each of the n-type transistors within the set 420.

Figure 5:
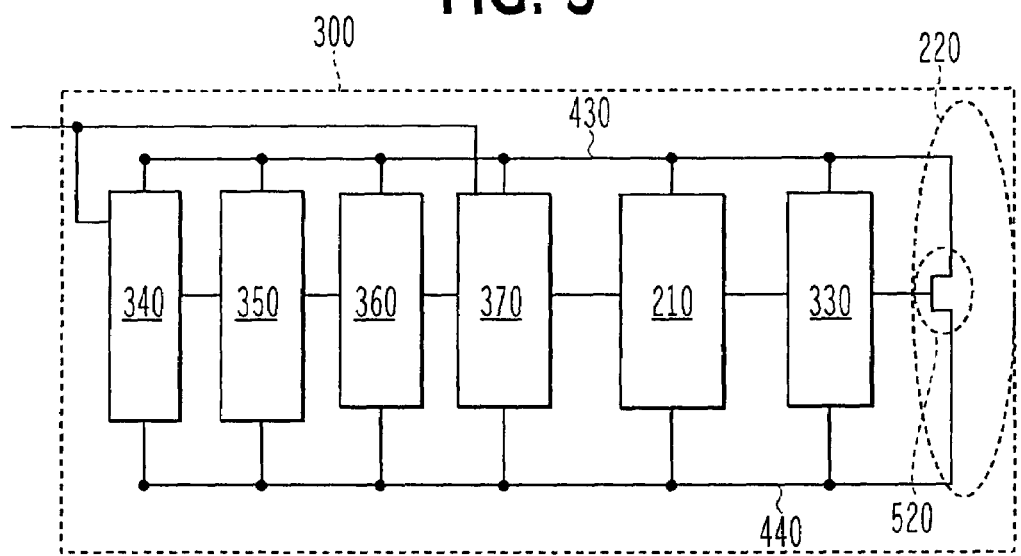
FIG. 5 is a diagram of the resonance reduction circuit from FIG. 3 and further showing a current dissipation stage according to an example arrangement.

FIG. 5 is a diagram of the resonance reduction circuit from FIG. 3 and further showing details of the current dissipation stage 220 according to an example arrangement. Other arrangements are also possible. The current dissipation stage 220 may contain an n-type transistor 520, for example, having a greater width than the transistors in other stages. The n-type transistor 520 may be electrically coupled between VCC 430 and VSS 440. The current dissipation stage 220 may receive sensing information regarding resonance and may appropriately dump a charge. The n-type transistor may also be called a current dumping transistor or current dumping device.

Figure 6:
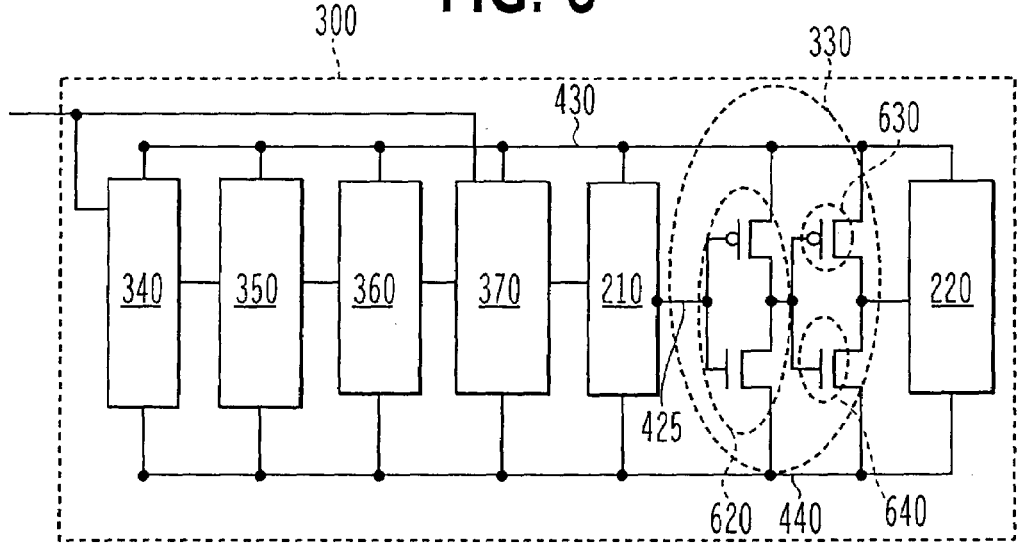
FIG. 6 is a diagram of the resonance reduction circuit from FIG. 3 and further showing an amplification stage according to an example arrangement.

FIG. 6 is a diagram of the resonance reduction circuit from FIG. 3 and further showing details of the amplification stage 330 according to an example arrangement. Other arrangements are also possible. The amplification stage 330 may contain a plurality of inverters 620 where each inverter is represented as an n-type transistor coupled to a p-type transistor. Only one of the invertors 620 is labeled in this figure. Each inverter 620 may include a p-type transistor 630 and an n-type transistor 640, for example. The transistors 630 and 640 may be electrically coupled between VCC 430 and VSS 440. The inverter 620 coupled to the sensing stage 210 by the signal line 425 may be skewed with a large amplification stage p-type transistor, whereas the inverter coupled to the current dissipation stage 220 may having a large amplification stage n-type transistor. The width of the p-type transistors 630 in the inverter 620 coupled to the sensing stage 210 may be greater than the width of the n-type transistor 640. Further, the width of the p-type transistor 630 in the inverter coupled to the current dissipation stage 220 may be approximately equal to the width of the n-type transistor 640.

FIG. 7 is a diagram of the resonance reduction circuit from FIG. 3 and further showing details of the enable stage 340 according to an example arrangement. Other arrangements are also possible. The enable stage 340 may contain a p-type transistor 710 and an n-type transistor 720 both electrically coupled between VCC 430 and VSS 440.

FIG. 8 is a diagram of the resonance reduction circuit from FIG. 3 and further showing details of the bias stage 350 according to an example arrangement. Other arrangements are also possible. The bias stage 350 may include a plurality of p-type transistors 810 and n-type transistors 820 electrically coupled between VCC 430 and VSS 440. The width of the p-type transistors 810 may be greater than the width of the n-type transistors 820.

FIG. 9 is a diagram of the resonance reduction circuit from FIG. 3 and further showing details of the bandwidth adjustment stage 360 according to an example arrangement. Other arrangements are also possible. The bandwidth adjustment stage 360 may include a p-type transistor 910 and an n-type transistor 920 coupled in parallel and electrically coupled between VCC 430 and VSS 440. The p-type transistor 910 and the n-type transistor 920 may both be long channel. The width of the p-type transistors 910 may be greater than the width of the n-type transistors 920.

FIG. 10 is a diagram of the resonance reduction circuit from FIG. 3 and further showing details of the alternating current (AC) input stage 370 according to an example arrangement. Other arrangements are also possible. The input stage 370 may include a p-type transistor 1010 and an n-type transistor 1020 electrically coupled between VCC 430 and VSS 440.

Figure 11:
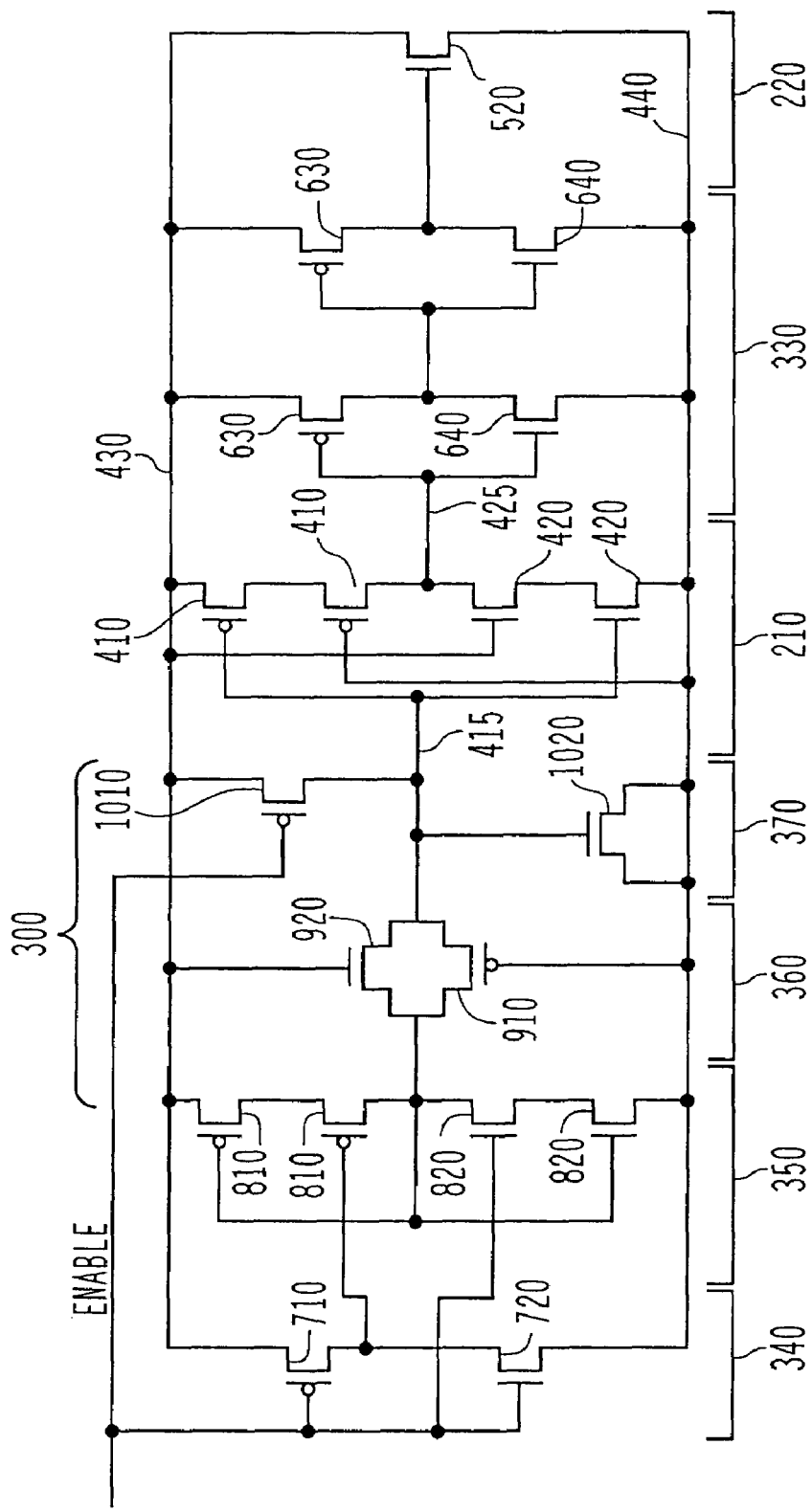
FIG. 11 illustrates a resonance reduction circuit according to an example arrangement.

FIG. 11 illustrates a resonance reduction circuit 300 according to an example arrangement. Other arrangements are also possible. More specifically, FIG. 11 shows each of the stages discussed above in one circuit. For ease of illustration, the details of the each of these stages will not be discussed again.

In past technology, resonant frequencies were on the order of 50 MHz and clock frequency was on the order of 30 MHz. In those technologies, it may not have mattered what speed the program enabled the microprocessor to run since the clock frequency of the processor was lower than the resonant frequency of the package. However, with future programmable processors, the clock rate may vary. As such, there may uncertainty of specific resonant frequencies for future processors. Consequently, circuit arrangements may be reactive over a broad clock frequency range and thereby adaptive to technological advances. This may permit individual component values to be adjusted.

Such circuit arrangements may reduce resonance amplitude and address problems of on-die power supply voltage loss induced by package resonance. Such circuit arrangements may utilize less on-die decoupling capacitance and on-die switched capacitors than in disadvantageous arrangements and embodiments so less leakage current may be induced.

Embodiments of the present invention may reduce the package resonance by using band-limited active damping. That is, when a switching current (i.e., an AC signal) applied to the resonance reduction circuit (RRC) has a large component in a filtered resonant frequency range and a rail voltage fluctuation (VCC−VSS) is larger than a designed threshold, then the resonance reduction circuit may generate a signal (hereafter also called an RRC signal) having substantially a same magnitude and substantially a same frequency as the switching signal but substantially 180 degrees out of phase with the switching signal. This RRC signal (along with the original switching current) may be output to a power dissipation network (PDN) (also called a power distribution network) so that the total AC current disappears in the resonant frequency range. The power dissipation network (or components associated with the PDN) may combine the switching current with the RRC signal to provide a total switching current. This signal may have less resonance than the original switching current.

Figure 12:
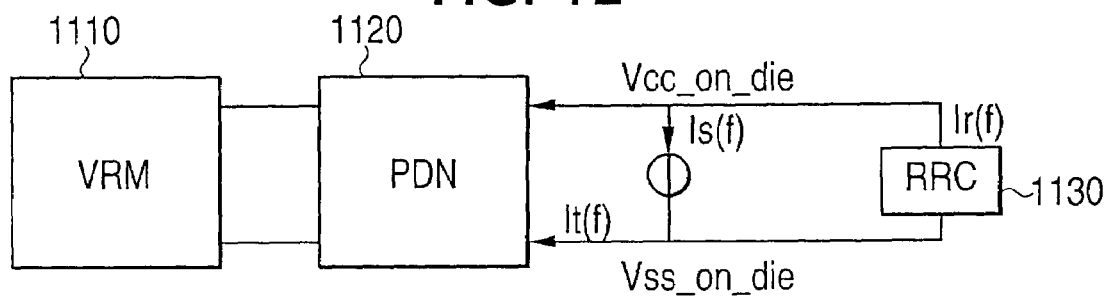
FIG. 12 is a chip block diagram and simulation model according to an example embodiment of the present invention.

More specifically, FIG. 12 is a block diagram and simulation model of a system that incorporates an example embodiment of the present invention. Other embodiments and configurations are also within the scope of the present invention. FIG. 12 shows a voltage regulator module (VRM) 1110 coupled to a power distribution network (PDN) 1120. The PDN 1120 supplies power to a chip, for example, by supplying a current Is(f). FIG. 12 also shows a resonance reduction circuit (RRC) 1130 that provides an RRC signal (shown as Ir(f)) having substantially a same magnitude and substantially a same frequency as the AC switching signal (shown as Is(f)) but 180 degrees out of phase with the AC switching signal Is(f). More specifically, when the switching current Is(f) has a large component in the resonant frequency range and the rail voltage fluctuation (VCC−VSS) is larger than a designed threshold, then the RRC 1130 may generate an AC current −Ir(f) having a same magnitude and a same frequency but 180 degrees out of phase with the switching circuit. The total AC current It(f) (combined by components of the system) may be fed through the PDN 1120 to the appropriate components to be powered, such as a chip or processor, for example. The total AC current is thereby a combination of both the AC switching current Is(f) and the RRC current Ir(f). The total AC switching current may be represented by the formula It(f)=Is(f)−Ir(f).

Unlike passive damping, the PDN 1120 impedance is not modified in the active damping. Rather, the current spectrum is changed, namely the AC current component in the resonance frequency range is substantially reduced. This effectively reduces the resonance in the PDN 1120 with little consumption of the die area since it does not require the large capacitors that eliminate the concern of large gate leakage current for advanced technologies.

Figure 13:
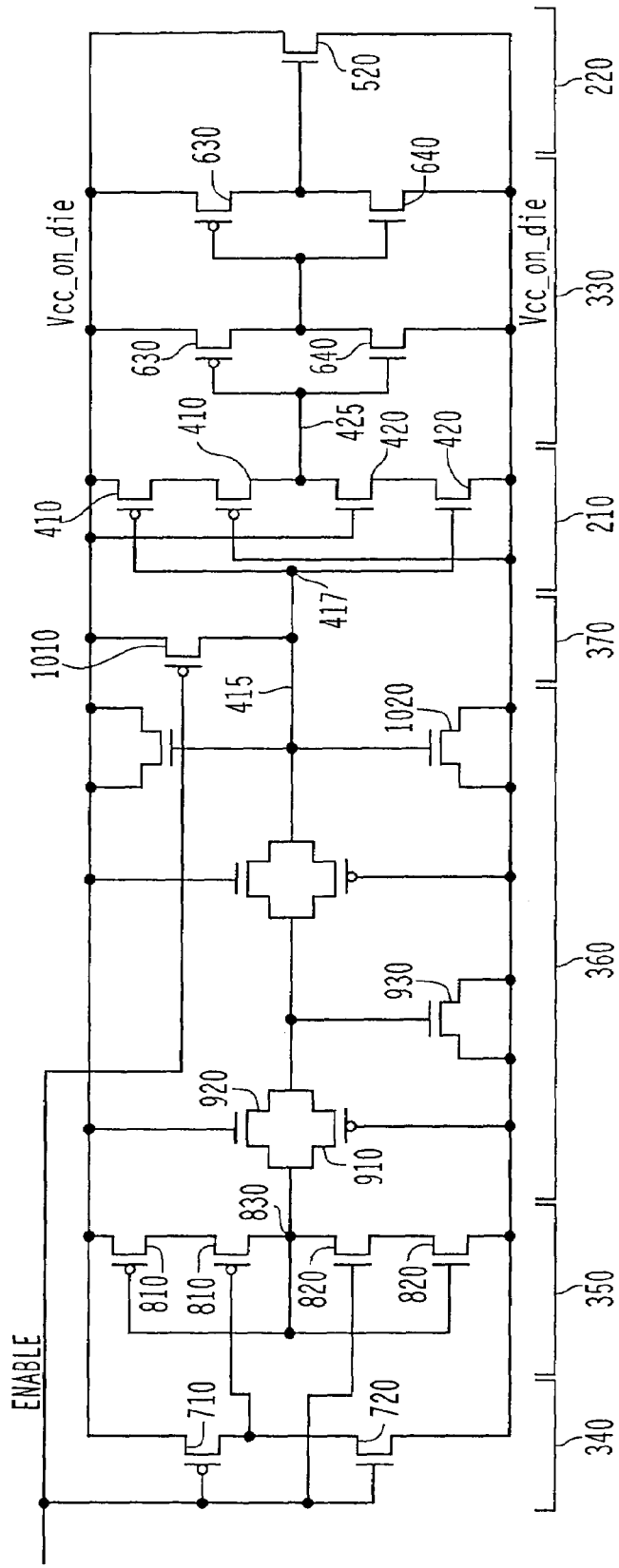
FIG. 13 illustrates a resonance reduction circuit (RRC) according to an example embodiment of the present invention.

FIG. 13 shows a resonance reduction circuit (RCC) according to an example embodiment of the present invention. Other embodiments and configurations are also within the scope of the present invention. The circuit shown in FIG. 13 includes many components shown in FIG. 11. For ease of illustration, these identical or similar components will not be described again. The resonance reduction circuit shown in FIG. 13 (or similar circuits) may be provided multiple times around a processor chip, or other type of chip or device. In FIG. 13, the resonance reduction circuit (RRC) includes a bias point 830 (or bias node) within the bias stage 350 that is dynamically biased at (VCC+VSS)/2. The bias point 830 corresponds to an input of the bandwidth adjustment stage 360, which functions as a band-pass filter. Based on the bias point 830, the band-pass filter (shown generally as the bandwidth adjustment stage 360) and the subsequent stages may eliminate an out-of-band signal, provide phase correction to reduce the delay, and send a differential sensing signal to the amplifier stage 330 along the signal line 425.

Figure 14:
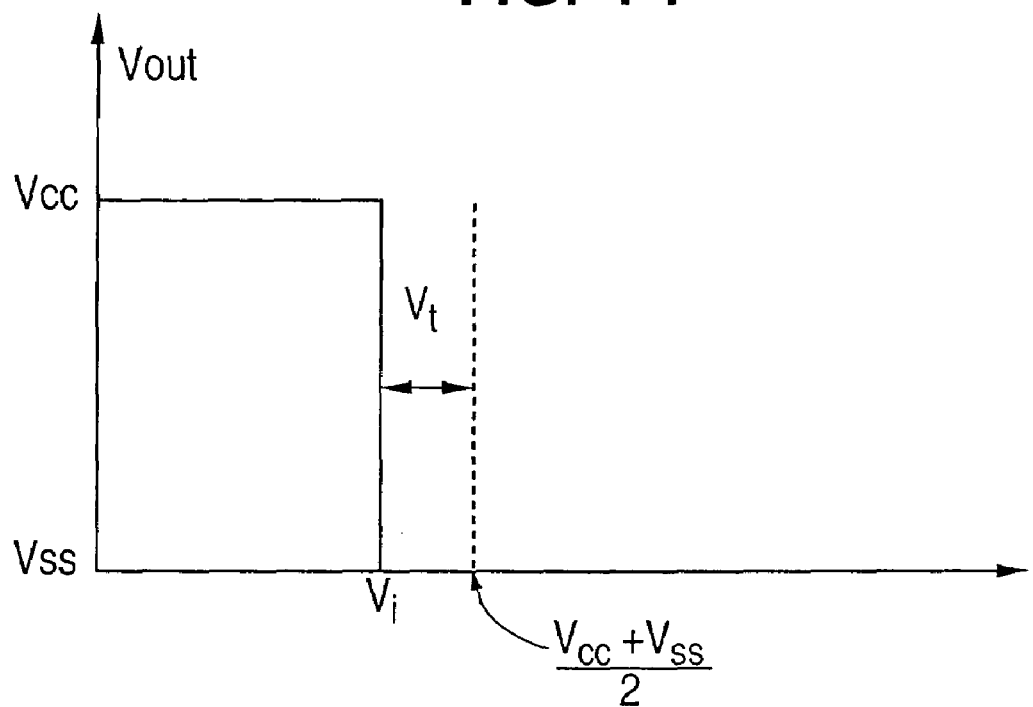
FIG. 14 is a graph illustrating operation of the resonance reduction circuit according to an example embodiment of the present invention.

When the RRC is turned ON and there is a differential mode rail voltage fluctuation Δ(VCC−VSS), then the AC switching signal from VSS may be coupled to a sensing node 417 (shown on signal line 415) through a capacitor 930 shown within the bandwidth adjustment stage 360. The signal at the node 417 may hereafter be called a sensing signal. The passive band-pass filter may attenuate the out-of-band signal with its center frequency located at the package resonance frequency, and send the band-limited differential mode sensing signal to the sensing node 417, which corresponds to an input of a three-stage amplifier in FIG. 13. Other numbers of stages of the amplifier are also within the scope of the present invention. If a(f) represents the attenuation factor of the passive band-pass filter, then the AC voltage at the sensing node 417 may be represented as a(f)·Δ(VCC−VSS). The three-stage amplifier (generally shown as the amplifier stage 330 and the sensing stage 210) shown in FIG. 13 may be designed such that it behaves like an infinite-gain amplifier (or a digital inverter) with a very sharp transition at Vi below (VCC+VSS)/2. For example, FIG. 14 is a graph showing a DC-transfer function of the three-stage amplifier according to an example embodiment of the present invention. FIG. 14 specifically shows the sharp transition at Vi. FIG. 14 also shows the amplifier threshold voltage Vt. The amplifier threshold voltage Vt may be represented as Vt=(VCC+VSS)/2−Vi.

Each time the voltage at the sensing node 417 drops below Vi, or equivalently when half of the AC voltage at the sensing node 417 is larger than the amplifier threshold, the current dissipating transistor 520 (of the current dissipation stage 220) is turned ON by the three-stage amplifier to generate a 180 degree out of phase current signal to compensate for the same frequency switching current. Stated differently, the RRC may turn ON and dump current through the current dissipation transistor 520 to reduce the package resonance when the voltage at the sensing node 412 drops below Vi. However, when the voltage at the sensing node 417 is above Vi, the current dissipation transistor 520 is OFF (or completely shut down). The current dissipation transistor 520 may be turned OFF during the half cycle when (VCC−VSS) goes down since turning ON the current dissipating transistor 520 can only increase the total AC current and therefore the rail voltage resonance rather than reducing the total AC current.

The bandwidth adjustment stage 360 and the amplifier stage 330 (effectively functioning as the band-pass filter and the three-stage amplifier) may thereby set the threshold Vt of the rail voltage fluctuation magnitude above which the resonance reduction circuit may turn ON. The amplifier stage 330 may also act as a voltage-controlled band-pass filter. That is, the resonance reduction circuit may turn ON within the frequency range when the voltage fluctuation magnitude is larger than Vt, and may turn OFF outside the frequency range. The current dissipating transistor 520 may thereby generate AC current components around the resonant frequency to offset the same frequency AC switching current.

The bandwidth adjustment stage 360, the amplification stage 330 and the current dissipation stage 220 (functioning as a band-pass filter, amplifier and current dissipation transistor, respectively) may effectively form a negative feedback loop having a specific choice for the amplifier threshold voltage (Vt) and the band-pass filter attenuation factor a(f) since the resonance reduction circuit only responds by turning ON within a frequency window that is determined by the threshold voltage Vt and the band-pass filter attenuation factor a(f) at any given AC current level Is(f), and the RRC completely turns OFF (i.e., zero gain) outside the window. At high frequency, the impedance of the PDN may be so small that it requires an impossibly huge current Is(f) to generate rail voltage fluctuation larger than Vt. Therefore, the RRC may remain stable even if the phase shift approaches 360 degrees at high frequency since it has zero gain. The proper choice of Vt also ensures that the RRC is worry-free from process variation and gate leakage as well.

Figure 15:
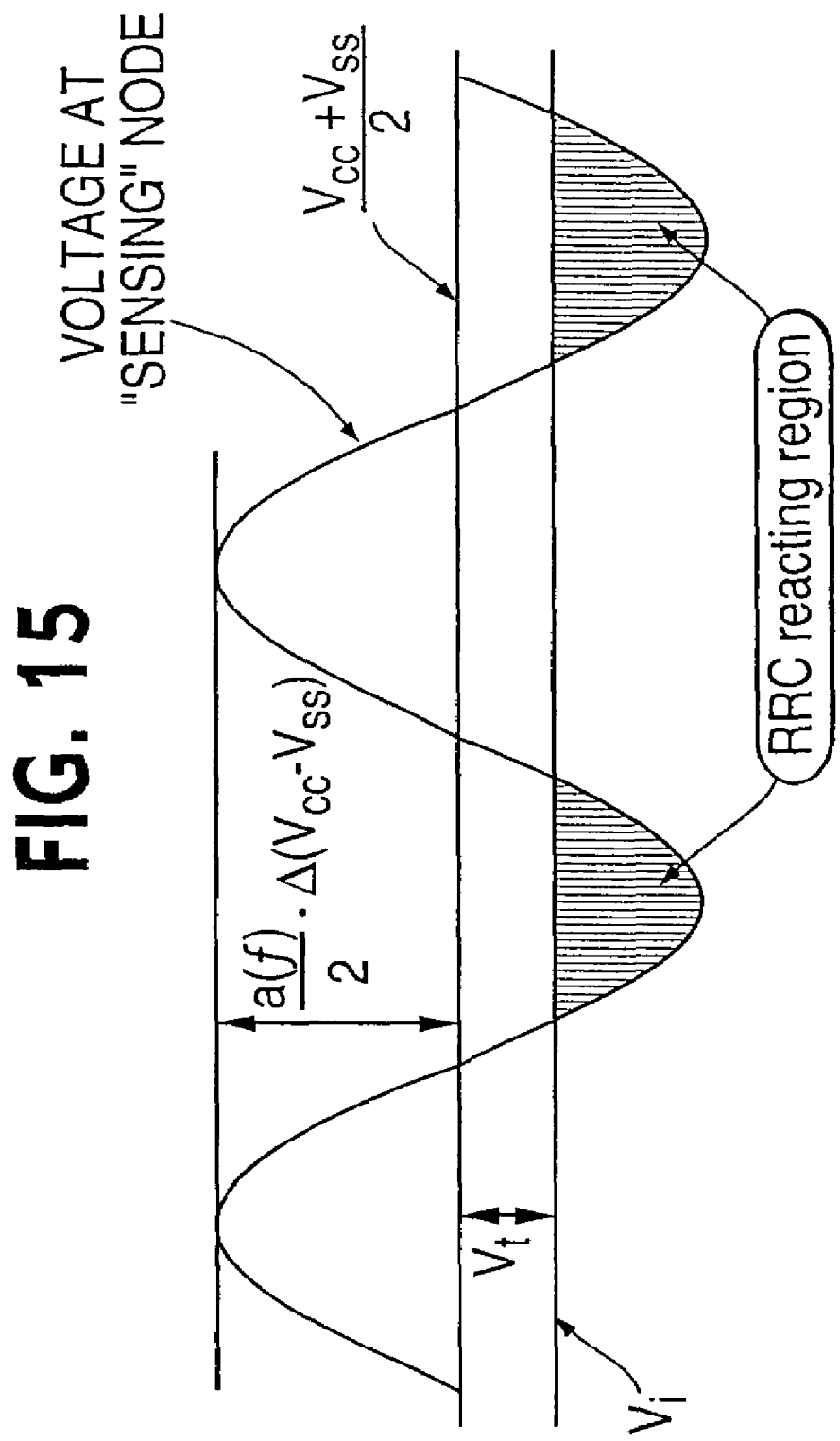
FIG. 15 is a graph showing the RRC operation according to an example embodiment of the present invention.

FIG. 15 is a graph illustrating the RRC operation assuming a sinusoidal AC switching current. The shaded areas of the graph represent regions where the RRC reacts and the current dissipation transistor 520 is turned ON.

Figure 16:
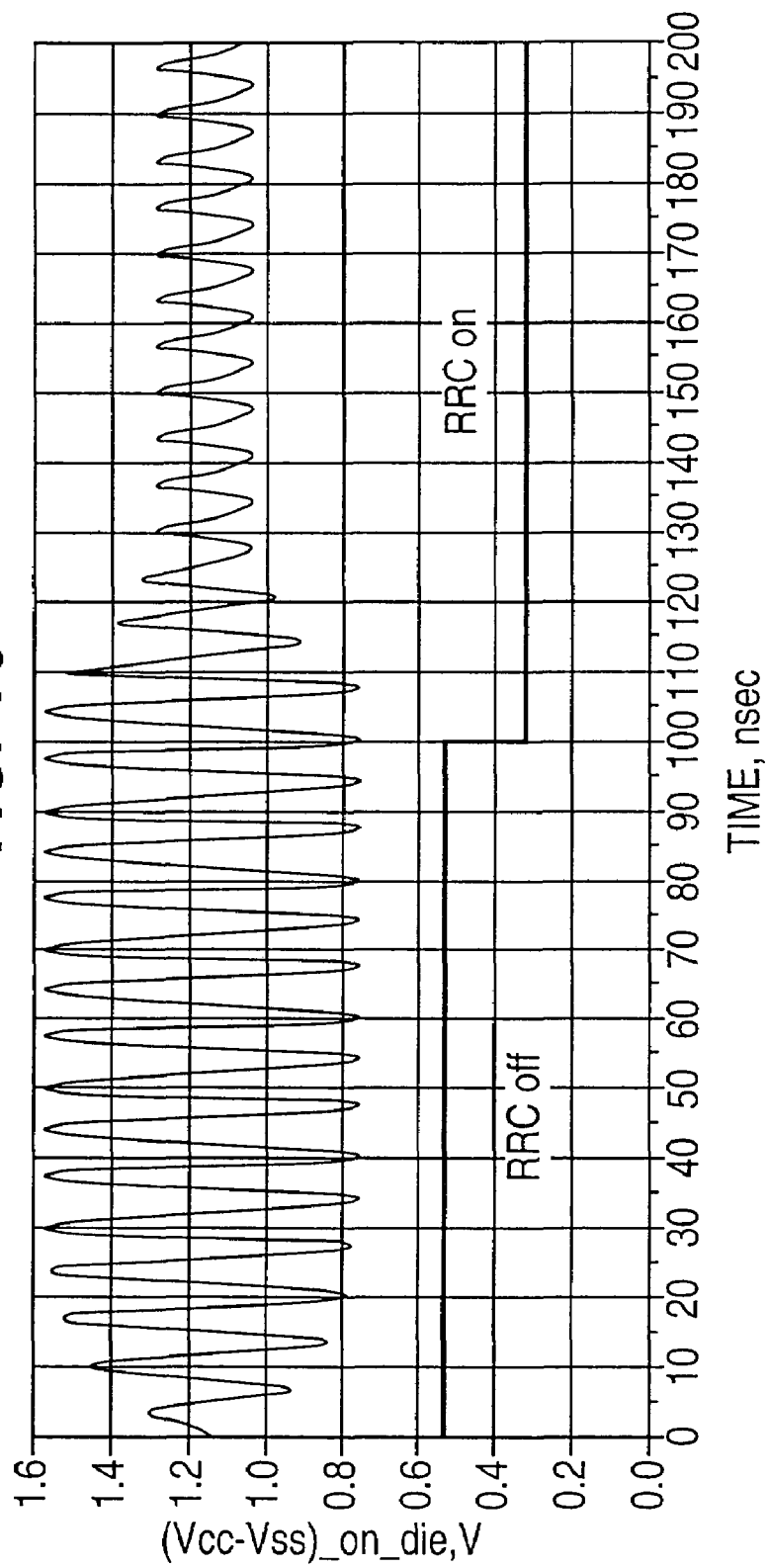
FIG. 16 is a graph showing the rail voltages at the resonance frequency with the RRC ON and with the RRC OFF.

FIG. 16 is a graph showing the rail voltage at the resonance frequency with the RRC ON and with the RRC OFF. As may be seen, the rail voltage fluctuation is substantially reduced when the RRC is ON as compared to when the RRC is OFF. More specifically, the RRC shows a 60% resonance reduction with 40 A peak-to-peak current at resonance frequency.

Embodiments of the present invention may thereby provide a sensing circuit with a band-pass filter that detects an AC signal within a designed frequency range. If the resonance amplitude is larger than a designated threshold of the amplifier, then the circuit generates an AC current component at the same frequency with 180 degree phase delay to cancel the AC current in the power supply system. The threshold serves as a voltage-controlled band-pass filter, ensures that the feedback loop is always stable, and immunizes the proper functionalities of the resonance reduction circuit from process variations.

In the above described resonance reduction implementations, resonance reduction services may be provided across power grid connections. A resonance sensor may detect for predetermined resonance across power grid connections, such as Vcc (e.g. collector common voltage) and Vss (e.g.

ground). Supply resonance may then be detected with an example N-channel metal-oxide-semiconductor (NMOS) device capacitor. Upon detection of a predetermined resonance (e.g. above a maximum allowable threshold), a current dumper may open at least one gating transistor to dump (i.e., bleed) charges from a first power grid connection (Vcc) to a second power grid connection (Vss) of a differing potential than the first power grid connection. As one example, an example embodiment may remove charges by dissipating current through a current source NMOS. Bleeding off of charges prevents and/or counters (i.e., damps) any resonance from building to further unacceptable levels. As one example of predetermined resonance, when Vcc–Vss is detected as being larger than an average Vcc–Vss, an example embodiment may dump a charge away from Vcc. Alternatively, charges may be returned to Vcc (e.g. from a node with a higher potential than Vcc) when detecting less charges or energy in the power system, e.g. when Vcc–Vss is smaller than the averaged Vcc–Vss. Separate resonance reduction circuits may be used to effect each of the aforementioned charge dumping and returning operations.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A circuit comprising:
    a first portion to sense a signal within a frequency range; and
    a second portion to generate a signal having a current component at substantially a same frequency and substantially 180 degrees out of phase from the sensed signal; and
    a combining circuit to provide a total switching signal to power a device by combining a switching signal corresponding with the sensed signal and the signal having the current component.

2. The circuit of claim 1, wherein the second portion generates the signal when a resonance amplitude is greater than a designated threshold.

3. The circuit of claim 1, wherein the second portion comprises a transistor to output the signal having the current component.

4. The circuit of claim 1, wherein the total switching signal has less resonance than the switching signal.

5. The circuit of claim 1, further comprising a band-pass portion to provide a bias point for a band-pass filter and to provide a sensing signal.

6. The circuit of claim 5, further comprising an amplifier portion to receive the sensing signal from the band-pass portion.

7. The circuit of claim 6, wherein the second portion turns ON when the sensing signal is greater than a threshold of the amplifier portion.

8. The circuit of claim 7, wherein the second portion turns OFF when the sensing signal is less than the threshold of the amplifier portion.

9. The circuit of claim 1, wherein the circuit turns ON when the sensed signal has a component within a frequency range and when a voltage fluctuation magnitude is greater than a threshold, and the circuit turns OFF when the sensed signal is outside of the frequency range.

10. A system comprising:
    a power distribution network to provide a switching current;
    a resonance reduction circuit to sense the switching current within a frequency range and to generate a resonance reduction signal having a current component at substantially a same frequency and substantially 180 degrees out of phase from the sensed switching current; and
    wherein the power distribution network provides a total switching current to power a device by combining the switching current and the resonance reduction signal.

11. The system of claim 10, further comprising a processor coupled to the power distribution network, the processor being powered by the total switching current.

12. The system of claim 10, wherein the resonance reduction circuit generates the resonance reduction signal when a resonance amplitude is greater than a designated threshold.

13. The system of claim 10, wherein the resonance reduction circuit comprises a transistor to output the resonance reduction signal.

14. The system of claim 10, wherein the resonance reduction circuit includes a band-pass portion to provide a bias point for a band-pass filter and to provide a sensing signal.

15. The system of claim 14, wherein the resonance reduction circuit further includes an amplifier portion to receive the sensing signal from the band-pass portion.

16. The system of claim 15, wherein the resonance reduction circuit turns ON when the sensing signal is greater than a threshold of the amplifier portion.

17. The system of claim 16, wherein the resonance reduction circuit turns OFF when the sensing signal is less than the threshold of the amplifier portion.

18. The system of claim 10, wherein the resonance reduction circuit turns ON when the sensed switching current has a component within a frequency range and when a voltage fluctuation magnitude is greater than a threshold, and the circuit turns OFF when the sensed switching current is outside of the frequency range.

19. A system comprising:
    a circuit to generate a resonance reduction signal having a current component at substantially a same frequency and out of phase from a switching signal; and a power distribution network to provide the switching signal and to provide a total switching current to power a device by combining the switching current and the resonance reduction signal.

20. The system of claim 19, wherein the resonance reduction signal is substantially 180 degrees out of phase from the switching signal.

21. The system of claim 19, further comprising a processor coupled to the power distribution network, the processor being powered by the total switching current.

22. The system of claim 19, wherein the circuit generates the resonance reduction signal when a resonance amplitude is greater than a designated threshold.

23. The system of claim 19, wherein the circuit comprises a transistor to output the resonance reduction signal.

24. The system of claim 19, wherein the circuit includes a band-pass portion to provide a bias point for a band-pass filter and to provide a sensing signal.

25. The system of claim 24, wherein the circuit further includes an amplifier portion to receive the sensing signal from the band-pass portion.

26. The system of claim 25, wherein the circuit turns ON when the sensing signal is greater than a threshold of the amplifier portion.

27. The system of claim 26, wherein the circuit turns OFF when the sensing signal is less than the threshold of the amplifier portion.

28. The system of claim 19, wherein the circuit turns ON when the sensed current has a component within a frequency range and when a voltage fluctuation magnitude is greater than a threshold, and the circuit turns OFF when the sensed current is outside of the frequency range.

29. A method comprising:

sensing a switching signal within a frequency range;

generating a resonance reduction signal having a current component at substantially a same frequency and substantially 180 degrees out of phase from the sensed switching signal; and powering a device using a power signal, the power signal combining the switching signal and the resonance reduction signal.

30. The method of claim 29, wherein generating the resonance reduction signal comprises determining when a resonance amplitude is greater than a designated threshold.

31. The method of claim 29, wherein powering the device includes providing a total switching signal by combining the switching signal corresponding with the sensed signal and the resonance reduction signal.

32. The method of claim 29, wherein generating the resonance reduction signal comprises turning ON a device when the sensed signal has a component within a frequency range and when a voltage fluctuation magnitude is greater than a threshold, and turning OFF the device when the sensed signal is outside of the frequency range.

33. The method of claim 29, wherein generating the resonance reduction signal comprises turning ON a transistor when the sensed signal is greater than a threshold.

34. The method of claim 33, further comprising turning OFF the transistor when the sensed signal is less than the threshold.

* * * * *